United States Patent
Wei et al.

(10) Patent No.: US 11,888,488 B2
(45) Date of Patent: Jan. 30, 2024

(54) INTEGRATED CIRCUIT, METHOD FOR SYNCHRONIZING CLOCKS THEREFOR AND ELECTRONIC DEVICE

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 158 days.

(21) Appl. No.: 17/515,233

(22) Filed: Oct. 29, 2021

(65) Prior Publication Data

US 2022/0173739 A1    Jun. 2, 2022

(30) Foreign Application Priority Data

Dec. 2, 2020  (CN) .......................... 202011406422.0

(51) Int. Cl.
| | |
|---|---|
| *H03K 5/135* | (2006.01) |
| *H03K 23/54* | (2006.01) |
| *H03K 19/20* | (2006.01) |
| *H03L 7/00* | (2006.01) |

(52) U.S. Cl.
CPC ............... *H03L 7/00* (2013.01); *H03K 5/135* (2013.01); *H03K 19/20* (2013.01); *H03K 23/542* (2013.01)

(58) Field of Classification Search
CPC .......... H03L 7/00; H03K 5/135; H03K 19/20; H03K 23/542; G06F 1/12; G06F 1/08
See application file for complete search history.

(56) References Cited

U.S. PATENT DOCUMENTS

| 8,996,906 | B1 * | 3/2015 | Townley | ................... | G06F 1/10 |
|---|---|---|---|---|---|
| | | | | | 326/46 |
| 10,564,666 | B2 * | 2/2020 | Morgan | ..................... | H04R 3/00 |
| 2008/0094117 | A1 * | 4/2008 | Stoler | ....................... | G11C 7/22 |
| | | | | | 327/141 |
| 2008/0284474 | A1 * | 11/2008 | Eaton | ........................ | G06F 1/08 |
| | | | | | 327/146 |

* cited by examiner

*Primary Examiner* — John W Poos
(74) *Attorney, Agent, or Firm* — IPro, PLLC (57) ABSTRACT

An integrated circuit is provided. The integrated circuit includes: a clock source configured to: generate a clock signal of the integrated circuit; at least two functional circuits; and at least two clock generators corresponding to the functional circuits and configured to: determine initial phases of the corresponding functional circuits, and generate clock signals of the functional circuits based on the clock signal of the integrated circuit and the initial phases, so as to keep the clock signals of all the functional circuits synchronized, wherein the initial phases are determined based on transmission distances, over which the clock signal of the integrated circuit is transmitted from the clock source to the functional circuits, and loads of the functional circuits.

20 Claims, 8 Drawing Sheets

INTEGRATED CIRCUIT, METHOD FOR SYNCHRONIZING CLOCKS THEREFOR AND ELECTRONIC DEVICE

CROSS-REFERENCE TO RELATED APPLICATION

This application claims priority to Chinese Patent Application No. 202011406422.0, filed on Dec. 2, 2020 and entitled "INTEGRATED CIRCUIT AND METHOD FOR DISTRIBUTING CLOCK SIGNALS THEREFOR", the disclosure of which is herein incorporated by reference in its entirety.

TECHNICAL FIELD

The present disclosure relates to the field of integrated circuit technologies, and in particular, relates to an integrated circuit, and a method for synchronizing clocks therefor and an electronic device.

BACKGROUND

Clocks, as basic functional units of an integrated circuit (IC), are equivalent to the heart of the IC for driving a digital circuit. With advances in the semiconductor technology, a feature size of a chip is decreasing year by year, and the number of transistors integrated in the chip per unit area is increasing exponentially.

SUMMARY

The present disclosure provides an integrated circuit, and a method for synchronizing clocks therefor and an electronic device.

In a first aspect, there is provided an integrated circuit. The integrated circuit includes:
a clock source configured to: generate a clock signal of the integrated circuit;
at least two functional circuits; and
at least two clock generators corresponding to the at least two functional circuits, wherein each of the clock generators is electrically coupled to the clock source and electrically coupled to a corresponding functional circuit, and is configured to:
generate a clock signal of the corresponding functional circuit based on the clock signal of the integrated circuit and an initial phase of the corresponding functional circuit, so as to keep clock signals of all the functional circuits synchronized,
wherein the initial phase is determined based on a transmission distance, over which the clock signal of the integrated circuit is transmitted from the clock source to the corresponding functional circuit, and a load of the corresponding functional circuit.

Optionally, the initial phase of the corresponding functional circuit is determined based on a clock delay of a reference circuit and a clock delay of the corresponding functional circuit, and the reference circuit is one of the at least two functional circuits; and
the clock delay of the corresponding functional circuit is determined based on the transmission distance, over which the clock signal of the integrated circuit is transmitted from the clock source to the corresponding functional circuit, and the load of the corresponding functional circuit.

Optionally, the integrated circuit further includes a control circuit, which is configured to:
determine, for each of the functional circuits, the clock delay of the functional circuit based on a transmission distance, over which the clock signal of the integrated circuit is transmitted from the clock source to the functional circuit, and a load of the functional circuit;
determine, for each of the functional circuits other than the reference circuit, an initial phase of the functional circuit based on a clock delay of the reference circuit and a clock delay of the functional circuit; and
send an initial phase of each of the functional circuits to a clock generator corresponding to the functional circuit to generate the clock signal of the functional circuit.

Optionally, the clock signal of the integrated circuit includes K clock pulses, and K is an integer greater than 1; an initial phase of the reference circuit may be 0;
if a clock delay of an $i^{th}$ functional circuit is smaller than or equal to the clock delay of the reference circuit, an initial phase $INV_t$ of the $i^{th}$ functional circuit satisfies:

$$INV_i=(\emptyset_0-\emptyset_i)\Delta;$$

and
if the clock delay of the $i^{th}$ functional circuit is greater than the clock delay of the reference circuit, the initial phase $INV_t$ of the $i^{th}$ functional circuit satisfies:

$$INV_t=K+(\emptyset_0-\emptyset_t)\Delta,$$

wherein $\emptyset_0$ represents the clock delay of the reference circuit, $\emptyset_t$ represents the clock delay of the $i^{th}$ functional circuit, $\Delta$ represents a phase difference between two adjacent clock pulses, and i is a positive integer not greater than a total number of the at least two functional circuits.

Optionally, K is equal to an integer power of 2. The reference circuit is the functional circuit with a maximum clock delay among the at least two functional circuits.

Optionally, each of the functional circuits is configured to: update the clock delay of the functional circuit based on a current load state of the functional circuit; and the control circuit is further configured to:
update the initial phase of each of the functional circuits based on an updated clock delay of the functional circuit; and
send an updated initial phase of each of the functional circuits to the clock generator corresponding to the functional circuit, so as to generate an updated clock signal of the functional circuit.

Optionally, the clock generators are clock generators based on time-average-frequency direct period synthesis; and clock signals of the functional circuits are generated based on the clock signal of the integrated circuit, control words of the clock generators and initial phases of the functional circuits.

Optionally, the integrated circuit further includes a control circuit, which is configured to:
send the acquired control words to each of the clock generators, respectively.

Optionally, the clock source is implemented in one of the following forms:
a Johnson counter, and a plurality of cross-coupled NAND gates.

Optionally, the integrated circuit further includes a newly-added functional circuit and a corresponding newly-added clock generator, wherein the newly-added clock generator is configured to:

determine an initial phase of the newly-added functional circuit; and generate a clock signal of the newly-added functional circuit based on the clock signal of the integrated circuit and the initial phase of the newly-added functional circuit, so as to keep the clock signal of the newly-added functional circuit and clock signals of other functional circuits synchronized, wherein the initial phase is determined based on a transmission distance, over which the clock signal of the integrated circuit is transmitted from the clock source to the newly-added functional circuit, and a load of the newly-added functional circuit.

In another aspect, a method for synchronizing clocks of an integrated circuit is provided. The integrated circuit includes a clock source, at least two functional circuits, and at least two clock generators corresponding to the at least two functional circuits. The method includes:

generating, by the clock source, a clock signal of the integrated circuit; and generating, by each of the clock generators, a clock signal of the corresponding functional circuit based on the clock signal of the integrated circuit and an initial phase of the corresponding functional circuit, so as to keep clock signals of all the functional circuits synchronized, wherein the initial phase is determined based on a transmission distance, over which the clock signal of the integrated circuit is transmitted from the clock source to the corresponding functional circuit, and a load of the corresponding functional circuit.

Optionally, the method further includes:

determining a clock delay of the corresponding functional circuit based on the transmission distance, over which the clock signal of the integrated circuit is transmitted from the clock source to the corresponding functional circuit, and the load of the corresponding functional circuit; and determining the initial phase of the corresponding functional circuit based on a clock delay of a reference circuit and the clock delay of the corresponding functional circuit, wherein the reference circuit is one of the at least two functional circuits.

Optionally, the integrated circuit further includes a control circuit; and the method further includes:

determining, by the control circuit and for each of the functional circuits, the clock delay of the functional circuit based on a transmission distance, over which the clock signal of the integrated circuit is transmitted from the clock source to the functional circuit, and a load of the functional circuit;

determining, by the control circuit and for each of the functional circuits other than the reference circuit, an initial phase of the functional circuit based on a clock delay of the reference circuit and a clock delay of the functional circuit; and sending, by the control circuit, an initial phase of each of the functional circuits to a clock generator corresponding to the functional circuit to generate the clock signal of the functional circuit.

Optionally, the clock signal of the integrated circuit includes K clock pulses, and K is an integer greater than 1; if a clock delay of an $i^{th}$ functional circuit is smaller than or equal to the clock delay of the reference circuit, an initial phase $INV_t$ of the $i^{th}$ functional circuit satisfies:

$INV_t=(\emptyset_0-\emptyset_t)/\Delta$;

and if the clock delay of the $i^{th}$ functional circuit is greater than the clock delay of the reference circuit, the initial phase $INV_t$ of the $i^{th}$ functional circuit satisfies:

wherein $\emptyset_0$ represents the clock delay of the reference circuit, represents the clock delay of the $i^{th}$ functional circuit, $\Delta$ represents a phase difference between two adjacent clock pulses, and i is a positive integer not greater than a total number of the at least two functional circuits.

Optionally, the method further includes: updating, by each of the functional circuits, the clock delay of the functional circuit based on a current load state of the functional circuit;

updating, by the control circuit, the initial phase of each of the functional circuits based on an updated clock delay of the functional circuit; and sending, by the control circuit, an updated initial phase of each of the functional circuits to the clock generator corresponding to the functional circuit, so as to generate an updated clock signal of the functional circuit.

Optionally, the clock generators are clock generators based on time-average-frequency direct period synthesis; and clock signals of the functional circuits are generated based on the clock signal of the integrated circuit, control words of the clock generators and initial phases of the functional circuits.

Optionally, the method further includes:

determining a newly-added functional circuit and a corresponding newly-added clock generator;

determining, by the newly-added clock generator, an initial phase of the newly-added functional circuit; and generating, by the newly-added clock generator, a clock signal of the newly-added functional circuit based on the clock signal of the integrated circuit and the initial phase of the newly-added functional circuit, so as to keep the clock signal of the newly-added functional circuit and clock signals of other functional circuits synchronized, wherein the initial phase is determined based on a transmission distance, over which the clock signal of the integrated circuit is transmitted from the clock source to the newly-added functional circuit, and a load of the newly-added functional circuit.

In another aspect, an electronic device is provided. The electronic device includes: a power supply circuit and an integrated circuit, wherein the power supply circuit is configured to supply power to the integrated circuit; and the integrated circuit includes:

a clock source configured to: generate a clock signal of the integrated circuit;

at least two functional circuits; and at least two clock generators corresponding to the at least two functional circuits, wherein each of the clock generators is electrically coupled to the clock source and electrically coupled to a corresponding functional circuit, and is configured to:

generate a clock signal of the corresponding functional circuit based on the clock signal of the integrated circuit and an initial phase of the corresponding functional circuit, so as to keep clock signals of all the functional circuits synchronized, wherein the initial phase is determined based on a transmission distance, over which the clock signal of the integrated circuit is transmitted from the clock source to the corresponding functional circuit, and a load of the corresponding functional circuit.

BRIEF DESCRIPTION OF THE DRAWINGS

For clearer descriptions of the technical solutions in the present disclosure or in the prior art, the following briefly introduces the accompanying drawings required for describing the embodiments or the prior art. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

It should be noted that, unless otherwise defined, the technical terms or scientific terms used in the present disclosure shall be taken to mean the ordinary meanings as understood by those of ordinary skills in the art to which the present disclosure belongs. The terms "first", "second", and the like used in the present disclosure do not denote any order, quantity, or importance, but are merely for the purpose of distinguishing different components. The terms "comprise", "include", or the like are intended to mean that the elements or objects appearing before said term cover the elements or objects or equivalents listed after said term, but do not exclude other elements or objects. The terms "connecting", "connected", or the like are not limited to physical or mechanical connections, but may include electrical connections, regardless of direct or indirect connections.

With the rapid development of artificial intelligence and the 5th-generation mobile communication technology (5G), the demands of upper-level applications for integrated circuits have gradually increased, and a highly-integrated system-on-chip has become the key to driving the upper-level applications. Under the current manufacturing process, the integration level of the integrated circuit increases exponentially with Moore's Law, and a single chip or wafer may integrate tens of billions of transistors. Such a large number makes the entire system-on-chip extremely complicated and causes many problems. For example, the timing of the integrated circuit (for example, the system-on-a-chip (SoC)) becomes extremely complicated and is difficult to converge, and a large number of circuits such as buffers, synchronizers, and clock generators need to be consumed to make up for a timing deviation generated during clock distribution.

For example, the communication between various functional circuits of the integrated circuit needs to meet the requirement of timing convergence, but long-distance transmission and high load set up barriers to the convergence, leading to violations in terms of the setup time and the hold time. For another example, to meet the communication requirements, a handshake signal needs to be added, which results in additional overhead for chips that are originally resource-constrained. In addition, to meet the requirements on setup time and hold time, buffers, local clock generators and the like need to be added to the integrated circuit, which will prolong the design cycle and increase the difficulty in verification.

In some solutions, clock sources are generated at the same location (that is, the same clock source) and distributed to individual functional circuits. At this point, a clock delay of each clock path is generally compensated by a delay unit. Assuming that the delay duration of a delay unit is 1 nanosecond (ns), and there are 10 clock paths (i.e., corresponding to 10 functional circuits) in an integrated circuit, the clock delay of each clock path is then 1 ns-10 ns, respectively. In this solution, the clock path with the clock delay of 10 ns may be kept unchanged, and the clocks of another 9 clock paths may be delayed to 10 ns by the delay unit, respectively. In this way, the clocks of the 10 paths are at the same level, i.e., with the same clock arrival time. That is, a synchronization operation may be performed after clock synchronization is completed. However, this method has many disadvantages, for example, including: 1) clock generators and the delay units are separated, that is, the circuit of a clock network needs to be designed separately after a circuit architecture design is completed; 2) when the function of the SoC is very complicated, such as due to the integration of hundreds of millions of transistors, the number of circuits that need to be added to compensate for the delay becomes very large; 3) the complex clock network will affect the layout and wiring of the chip; 4) the delay units with different levels of precision are needed to deal with various situations; and 5) if the loads of the functional circuits have a very wide range of variation, a variety of solutions need to be prepared to deal with different scenarios, and once a clock distribution network is determined, the delay units may not be modified after the chip is produced.

In view of this, the present disclosure provides an integrated circuit, and a method for synchronizing clocks therefor and an electronic device. The integrated circuit includes: a clock source configured to: generate a clock signal of the integrated circuit; at least two functional circuits; and at least two clock generators corresponding to the functional circuits and configured to: determine initial phases of the corresponding functional circuits, and generate clock signals of the functional circuits based on the clock signal of the integrated circuit and the initial phases, so as to keep the clock signals of all the functional circuits synchronized, wherein the initial phases are determined based on transmission distances, over which the clock signal of the integrated circuit is transmitted from the clock source to the functional circuits, and loads of the functional circuits.

In the integrated circuit, and the method for synchronizing the clocks therefor and the electronic device thereof according to the present disclosure, the uniform clock distribution is realized by using the clock signals generated by the same clock source, and based thereon, the clock signals generated based on the initial phase of the corresponding functional circuits are provided to the corresponding functional circuits by using the clock generators, thereby effectively solving the problem of timing violations, simplifying a design process, accelerating the timing convergence and reducing the cost and overhead. Moreover, the present disclosure can be reused as digital IP among different processes, and has characteristics such as low power consumption and small area.

Figure 1:
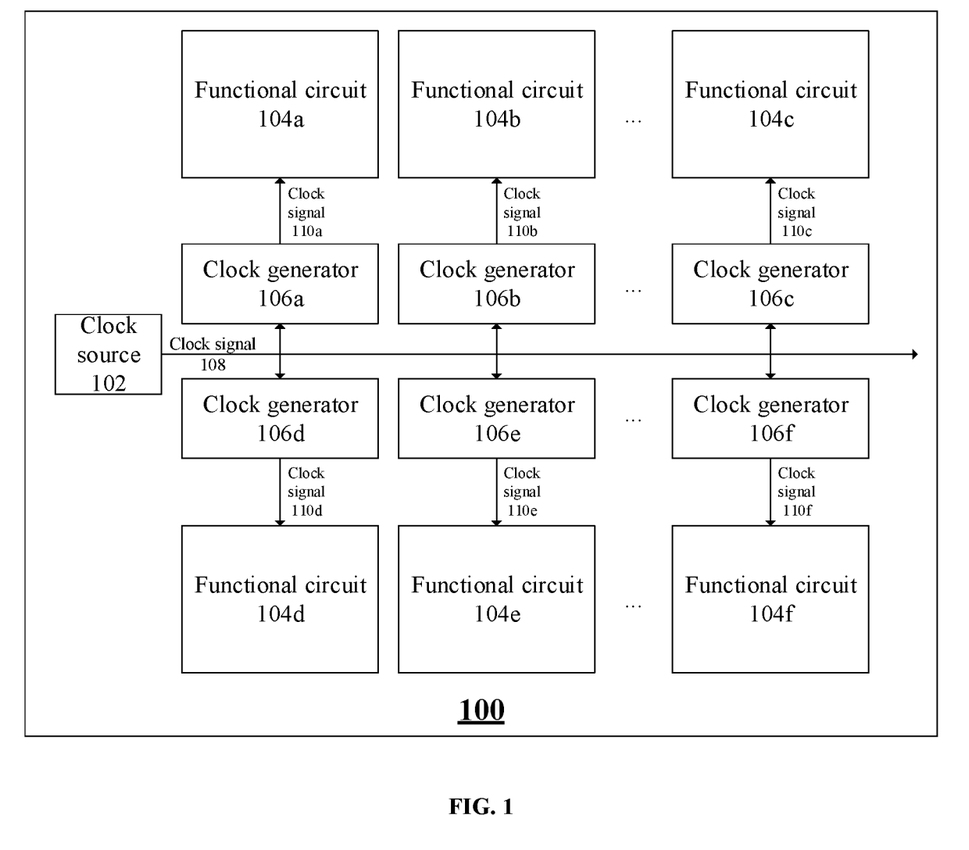
FIG. 1 illustrates a schematic structural diagram of an exemplary integrated circuit according to an embodiment of the present disclosure.

FIG. 1 illustrates a schematic structural diagram of an exemplary integrated circuit 100 according to an embodiment of the present disclosure.

As illustrated in FIG. 1, the integrated circuit 100 may include a clock source 102, a plurality of functional circuits 104a-104f, and a plurality of clock generators 106a-106f. The clock source 102 may be electrically coupled to each of the clock generators 106a-106f to transmit a clock signal 108 to the respective clock generators 106a-106f. The clock generators 106a-106f may be electrically coupled to the functional circuits 104a-104f in a one-to-one correspondence, so as to correspondingly send clock signals 110a-110f to the respective functional circuits 104a-104f.

Figure 2:
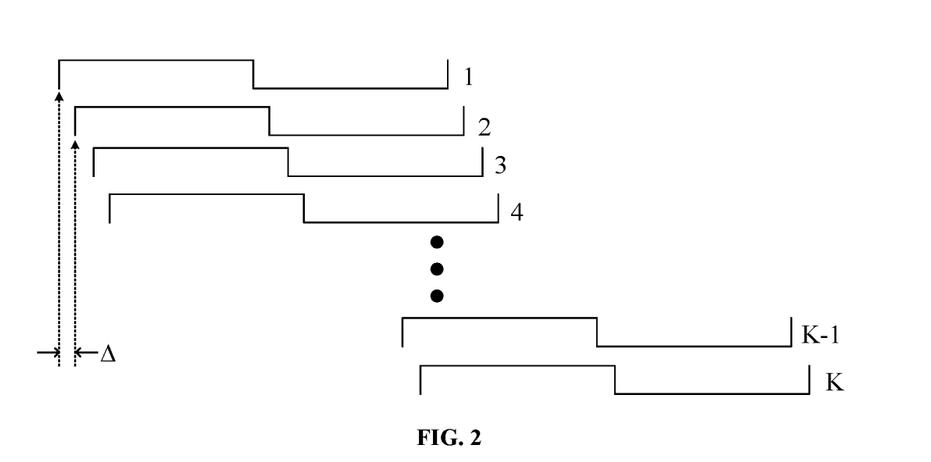
FIG. 2 illustrates a schematic diagram of an exemplary clock signal according to an embodiment of the present disclosure.
Figures 3, 4:
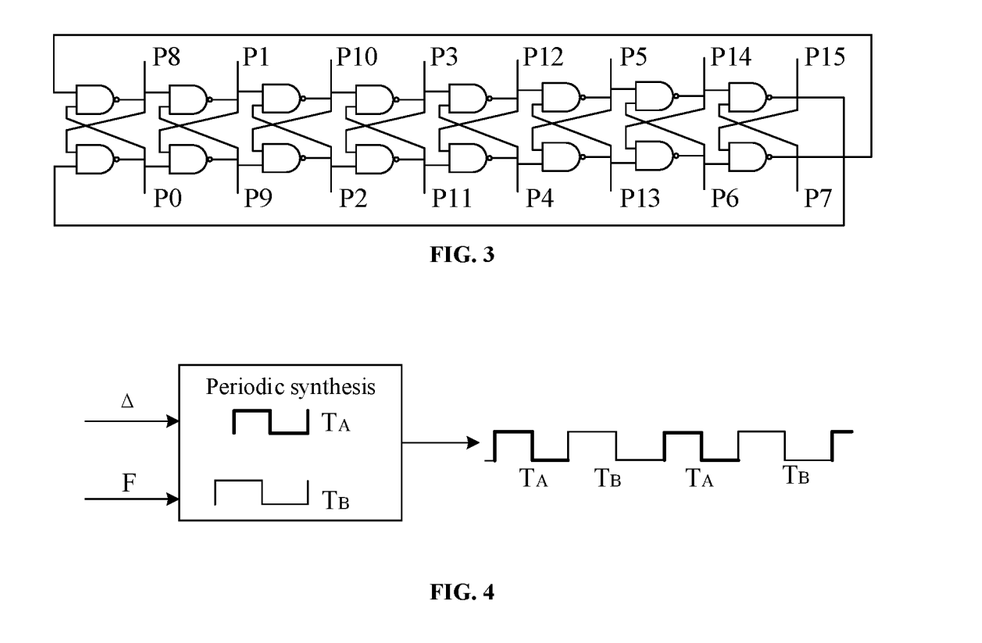
FIG. 3 illustrates a schematic diagram of an exemplary circuit where a clock source is implemented by cross-coupled NAND gates according to an embodiment of the present disclosure.
FIG. 4 illustrates a schematic diagram of an exemplary principle of an output pulse according to an embodiment of the present disclosure.

The clock source 102 may generate a clock signal 108 of the integrated circuit 100. In some embodiments, as illustrated in FIG. 2, the clock signal 108 may include K clock pulses with equal phase intervals, wherein K is an integer greater than 0, and A represents a phase between two adjacent clock pulses among the K clock pulses. In some embodiments, a value of K may be an exponential power of 2, for example, 8, 16, or 32, etc. In some embodiments, the clock source 102 may be implemented by a Johnson counter or a plurality of cross-coupled NAND gates. FIG. 3 illustrates a schematic diagram of an exemplary circuit where the clock source 102 is implemented by the cross-coupled NAND gates according to an embodiment of the present disclosure. For example, in the embodiment illustrated in FIG. 3, the value of K is 16. That is, the clock signal 108 may include 16 clock pulses, which may be output from a signal terminal P0 to a signal terminal P15.

The functional circuits 104a-104f may be acquired by dividing the integrated circuit 100 by specific functions. Each of the functional circuits may accomplish a certain subdivision function, for example, Fourier transform, digital filtering, mathematical operation or logic operation, etc. Each of the functional circuits includes a plurality of digital circuits, and the clock signals of all the digital circuits within each of the functional circuits may be provided by a corresponding clock generator (for example, any one of clock generators 106a-106f).

The clock generators 106a-106f may determine initial phases of the corresponding functional circuits 104a-104f, and generate the clock signals 110a-110f of the functional circuits 104a-104f based on the clock signal 108 of the integrated circuit 100 and the initial phases, so as to keep the clock signals 110a-110f of all the functional circuits 104a-104f synchronized.

The initial phases are determined based on transmission distances, over which the clock signal 108 of the integrated circuit is transmitted from the clock source 102 to the functional circuits 104a-104f, and loads of the functional circuits 104a-104f. In some embodiments, each of the clock generator may be a component of the corresponding functional circuit thereof, and is configured to generate the clock signal required by the functional circuit. In some embodiments, each of the functional circuits may correspond to one clock generator (as illustrated in FIG. 1), or each of the functional circuits may correspond to a plurality of clock generators.

It can be understood that when generating the clock signals of the functional circuits according to the clock signal 108 of the integrated circuit 100 and the initial phases of the corresponding functional circuits, the clock generators may start working (or referred to as start oscillation) with the initial phases of the corresponding functional circuits as initial working positions.

In some embodiments, the clock generators 106a-106f may be clock generators based on time-average-frequency direct period synthesis (TAF-DPS).

FIG. 4 illustrates a schematic diagram of an exemplary principle of an output pulse according to an embodiment of the present disclosure. TAF is mainly to form a pulse (also referred to as an output pulse) from pulses of various periods. The output pulse satisfies the effect of average frequency in a period of time, that is, the average frequency of the output pulse in a period of time may be equal to an average value of the frequencies of the various pulses. Moreover, the average frequency may also be understood as the number of pulses (or rising or falling edges) per unit time. The period of the output pulse may be described as:

$$T_{TAF}=(1-r)T_A+rT_B,$$

wherein $T_{TAF}$ represents a period of the output pulse of TAF-DPS, $T_A$ and $T_B$ represent two periods, r represents a probability that $T_B$ appears, and 1−r represents a probability that $T_A$ appears. The period $T_{TAF}$ of the output pulse may refer to an average period, or may be referred to as an equivalent period, rather than an instantaneous period.

Figure 5:
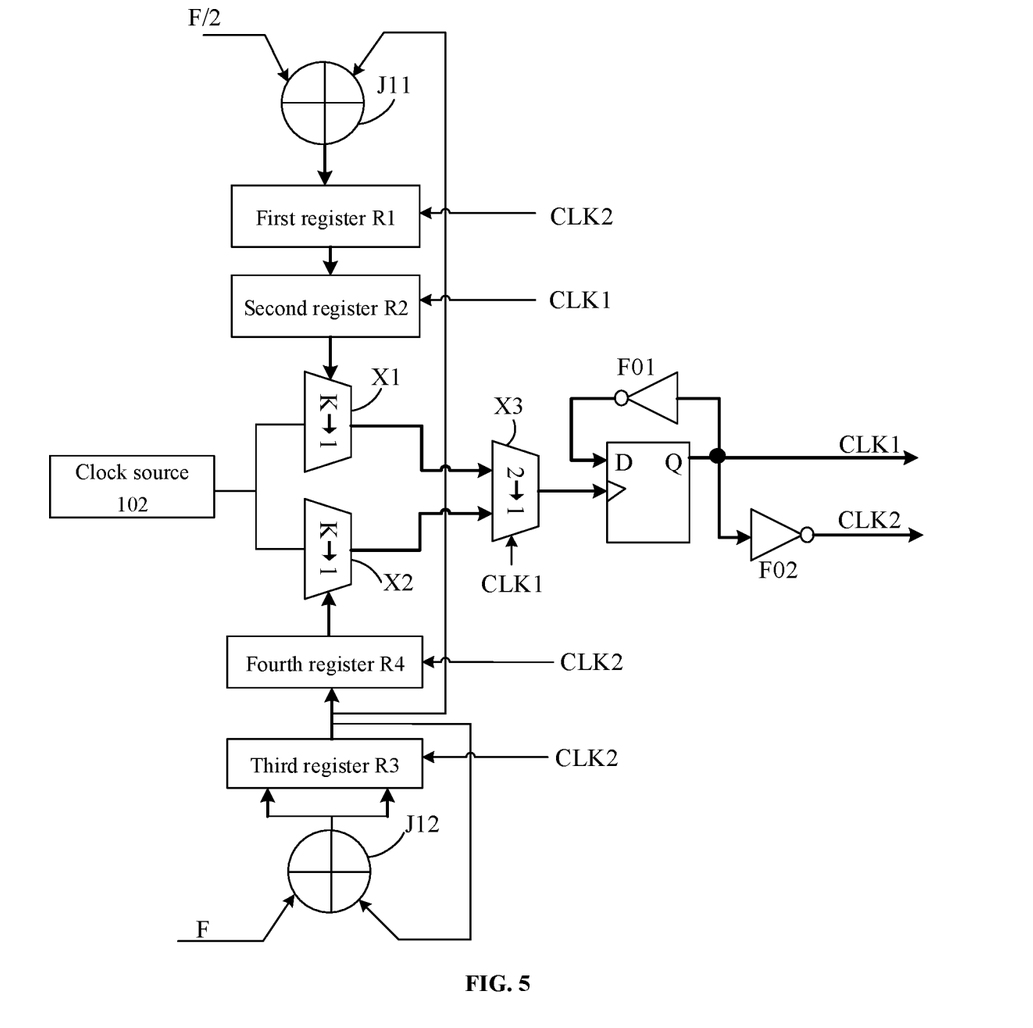
FIG. 5 illustrates a schematic diagram of a circuit structure of an exemplary clock generator according to an embodiment of the present disclosure.

FIG. 5 illustrates a schematic diagram of a circuit structure of an exemplary clock generator (for example, TAF-DPS) according to an embodiment of the present disclosure; As illustrated in FIG. 5, the clock generator may include: a first register R1, a second register R2, a third register R3, a fourth register R4, a first adder J11, a second adder J12, a first selector X1, a second selector X2, a third selector X3, a D flip-flop, a first phase inverter F01, and a second phase inverter F02.

The first adder J11 has one input terminal connected to the first register R1, and the other input terminal configured to input F/2 (F represents a control word of TAF-DPS); and an output terminal of the first adder J11 is connected to the first register R1. The first register R1 is also connected to a second clock signal terminal CLK2 and the second register R2, respectively. The second register R2 is connected to a first clock signal terminal CLK1 and the first selector X1, respectively. The first selector X1 has an input terminal connected to the clock source 102, and an output terminal connected to an input terminal of the third selector X3.

The second adder J12 has one input terminal connected to the third register R3, and the other input terminal configured to input F; and an output terminal of the second adder J12 is connected to the third register R3. The third register R3 is also connected to the second clock signal terminal CLK2 and the fourth register R4, respectively. The fourth register R4 is connected to the second clock signal terminal CLK2 and the second selector X2, respectively. The second selector X2 has an input terminal connected to the clock source 102, and an output terminal connected to the input terminal of the third selector X3.

An output terminal of the third selector X3 may be connected to a first input terminal of the D flip-flop and the first clock signal terminal CLK1. A second input terminal of the D flip-flop may be connected to an output terminal of the first phase inverter F01, and an input terminal of the first phase inverter F01 and an input terminal of the second phase inverter F02 may be connected to an output terminal of the D flip-flop. It can be understood that, referring to FIG. 5, the output terminal of the D flip-flop may be used as an input of the first clock signal terminal CLK1; an output terminal of the second phase inverter F02 may be used as an input of the second clock signal terminal CLK2; and clock signals provided by the first and second clock signal terminals CLK1 and CLK2 are opposite in phase and identical in frequency.

Optionally, the clock signal 108 generated by the clock source 102 may include K clock pulses. The first selector X1 and the second selector X2 may both be K→1 selectors (i.e., 1-out-of-K selectors), which may select one clock pulse to be output from the K clock pulses. The third selector X3 may be a 2→1 selector (i.e., a 1-out-of-2 selector), and is configured to select one clock pulse to be output from clock pulses output by X1 and X2.

The following describes the working principle of the clock generator with reference to FIG. 5:

The first adder J11 may add F/2 to the most significant bit (such as, 5-bit) of a value stored in the third register R3, and then save an addition result in the first register R1 at a rising edge of the second clock signal provided by the second clock signal terminal CLK2. Or, the first adder J11 may add F/2 to the value stored in the third register R3, and then save an addition result in the first register R1 at the rising edge of the second clock signal. At a rising edge of the next first clock signal, the most significant bits stored in the first register R1 will be stored in the second register R2 and used as a selection signal of the first selector X1. Accordingly, the first selector X1 may, in response to the selection signal, select one clock pulse from the K clock pulses as an output signal of the first selector X1 and output it to the third selector X3.

Similarly, the second adder J12 may add F to the most significant bit of a value stored in the third register R3, and then save an addition result in the third register R3 at the rising edge of the clock signal of the second clock signal terminal CLK2. Or, the second adder J12 may add F to the value stored in the third register R3, and then save an addition result in the third register R3 at the rising edge of the second clock signal. At a rising edge of the next second clock signal, information stored in the third register R3 will be stored in the fourth register R4 and act as the selection signal of the second selector X2. Accordingly, the second selector X2 may, in response to the selection signal, select one clock pulse from the K clock pulses as an output signal of the second selector X2 and output it to the third selector X3.

Further, the third selector X3 may, at the rising edge of the first clock signal, select either the output signal from the first selector X1 or the output signal from the second selector X2 as an output signal of the third selector X3, and output it to the D flip-flop as an input clock signal of the D flip-flop. Then, a clock signal output by either the output terminal of the D flip-flop or the output terminal of the second phase inverter F02 may be used as a final output signal, and at this point, the generation of the clock signals of the functional circuits is accomplished.

It can be understood that, for the clock generator based on TAF-DPS illustrated in FIG. 5, the initial phase of each of the functional circuits may be written into the second and fourth registers R2 and R4 of the corresponding clock generator. Hence, the first selector X1 and the second selector X2 may be allowed to start working at a position indicated by the initial phase INV. That is, the first selector X1 and the second selector X2 may start working from the $INV^{th}$ clock pulse of the K input clock pulses.

Based on the above analysis, it can be known that TAF-DPS is mainly intended to realize the working principle of TAF, and generate pulses (i.e., clock signals) of any frequency under the control of the control word F. A derivation process of the period $T_{TAF}$ of the output pulse of the TAF-DPS is as follows:

$$T_A = I \cdot \Delta, T_B = (I+1) \cdot \Delta$$

$$T_{TAF} = F \cdot \Delta (I+r) \cdot \Delta = I \cdot \Delta - I \cdot r \cdot \Delta + I \cdot r \cdot \Delta + r \cdot \Delta = (1-r) \cdot I \cdot \Delta + r \cdot (I+1) \cdot \Delta = (1-r) T_A + r T_B,$$

wherein F represents the control word of TAF-DPS, which satisfies F=I+r; I is an integer; r is a decimal between 0 and 1, and $\Delta$ is a phase difference between two adjacent pulses among the K clock pulses.

Assuming that the clock signal 108 transmitted to any clock generator TAF-DPS is a clock signal clk, compared with an ideal clock $clk_0$ of the TAF-DPS, a clock delay of the clock signal 108 transmitted to the TAF-DPS is $\Psi$. Then, a generation time $T_{clk}$ of a jumping edge (for example, a rising edge) of the clock signal 108 transmitted to the TAF-DPS may be described as:

$$T_{clk} = T_{clk0} + \Psi,$$

wherein $T_{clk}$ represents the generation time of the jumping edge (for example, the rising edge) of the ideal clock $clk_0$; and $\Psi$ represents a clock delay typically caused by long-distance line transmission and loads. Assuming that there are n functional circuits in the integrated circuit 100 (referring to FIG. 1, n is an integer greater than 1), the generation times $T_{clk1}$ to $T_{clkn}$ of the jumping edges of the clock signal 108 transmitted to the respective TAF-DPS may be then described as:

$$T_{clk1} = T_{clk0} + \psi_1,$$

$$T_{clk2} = T_{clk0} + \psi_2,$$

$$T_{clk3} = T_{clk0} + \psi_3,$$

$$\cdots$$

$$T_{clkn} = T_{clk0} + \psi_n,$$

wherein $\Psi_1, \Psi_2, \Psi_3, \ldots, \Psi_n$ represent clock deviations (i.e., clock delays) of n TAF-DPSs corresponding to the n functional circuits due to clock distribution; and $clk_0$ represents the ideal clock of the TAF-DPS. In order to satisfy the clock synchronization and timing convergence of the entire integrated circuit, in some embodiments, $\Psi_1, \Psi_2, \Psi_3, \ldots, \Psi_n$ may all be changed to 0 or the same value. That is, $$T_{clk1}=T_{clk2}=T_{clk2}=\ldots=\ldots=T_{clkn}=T_{clk0}\varphi+\Psi,$$

wherein .. represents any clock delay in the above-mentioned set of $\Psi_1, \Psi_2, \Psi_3, \ldots, \Psi_n$, and the clock delay is the clock deviation caused by line transmission and loads. φ represents clock compensation performed by the TAF-DPS. That is, the deviation caused by the line and the loads is compensated by using the TAF-DPS.

In order to satisfy the above formula, it is necessary to let φ=−Ψ. Therefore, in some embodiments, the initial phase of the TAF-DPS may be set (for example, the initial phase of the TAF-DPS is set to a certain fixed value based on a phase to be compensated) to realize φ=−Ψ, whereby the clock compensation may be completed.

In some embodiments, the clock signal 108 input to the TAF-DPS includes K clock pulses, each of which is different in phase. Based on the clock signal 108 containing the K clock pulses, the TAF-DPS may be allowed to start working (or referred to as start oscillation) from different positions.

Figure 6:
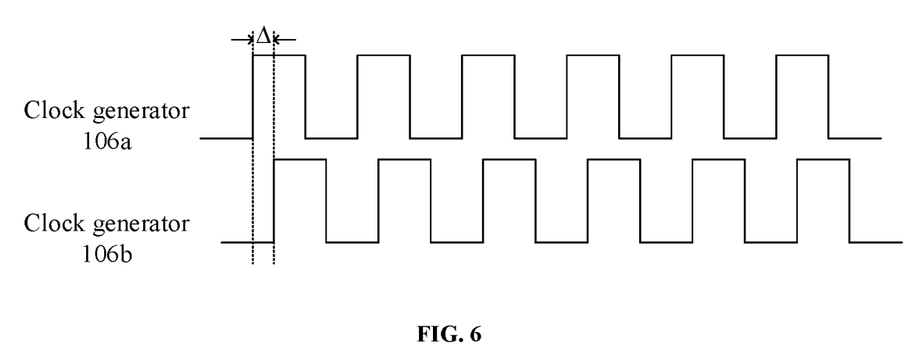
FIG. 6 illustrates a schematic diagram of an exemplary clock signal according to an embodiment of the present disclosure.

As illustrated in FIG. 2, it is assumed that the integrated circuit includes two clock generators 106a and 106b, which work under the same control word F but have different initial phases. The clock generator 106a starts working from a first clock pulse of the clock signal 108; the clock generator 106b starts oscillation from a second clock pulse of the clock signal 108; and then, the two may work all along by keeping a fixed clock phase difference. As illustrated in FIG. 6, the clock phase difference between the two will remain as Δ.

Assuming that the initial phase of the clock generator 106a is 0, the initial phase of the clock generator 106b may be represented by INV, showing a relation as follows:

$$INV=\Delta T/\Delta,$$

wherein ΔT represents a difference between a clock delay when the clock signal 108 is transmitted to the clock generator 106b and a clock delay when the clock signal 108 is transmitted to the clock generator 106a. That is, ΔT indicates a clock delay difference between the clock generator 106b and the clock generator 106a. A represents a phase difference between two adjacent clock pulses among the K clock pulses.

In some embodiments, the initial phases may also be determined by the following method including:

determining, for each of the functional circuits, the clock delay of the functional circuit based on a transmission distance, over which the clock signal of the integrated circuit is transmitted from the clock source to the functional circuit, and a load of the functional circuit; and determining initial phases of the functional circuits based on a clock delay of a reference circuit and the clock delays of the functional circuits, wherein the clock delay of the reference circuit is a basis for calculating the initial phase of each of the functional circuits, and the initial phase of the reference circuit may be set to 0. There are many solutions to selecting the reference circuit, which may be selected according to needs. For example, the functional circuit with a maximum clock delay in the at least two functional circuits may be selected as the reference circuit, and the initial phases of other functional circuits are all set by taking the functional circuit, of which the initial phase is 0, as a reference.

Figure 7:
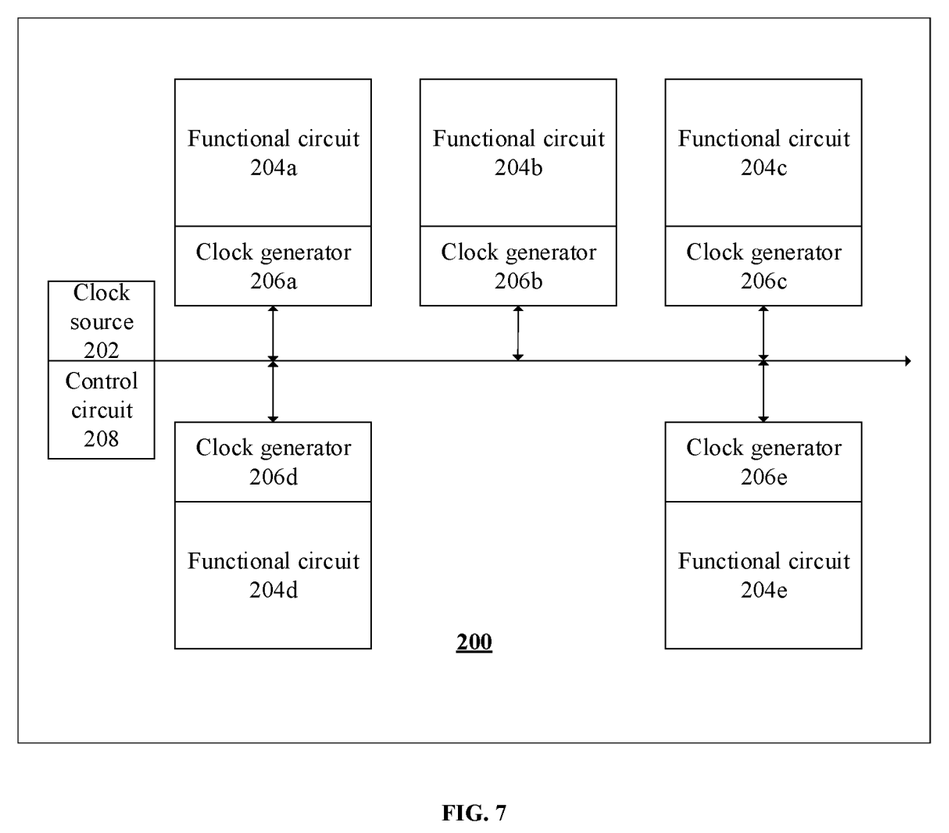
FIG. 7 illustrates a schematic structural diagram of another exemplary integrated circuit according to an embodiment of the present disclosure.

Optionally, as illustrated in FIG. 7, the integrated circuit may further include a control circuit 208. The control circuit 208 may be configured to: determine the initial phase of each of the functional circuits (including the reference circuit) by using the method described above; and send the initial phase of each of the functional circuits to the corresponding clock generator respectively, so as to generate the clock signal of the functional circuit.

In a scenario where the clock signal 108 of the integrated circuit includes K clock pulses and K is an integer greater than 1, the initial phase of the corresponding functional circuits other than the reference circuit may be determined as follows:

if the clock delay of the $i^{th}$ functional circuit is smaller than or equal to the clock delay of the reference circuit, the initial phase $INV_t$ of the $i^{th}$ functional circuit may satisfy:

$$INV_t=(\emptyset_0\emptyset_t)/\Delta;$$

and if the clock delay of the $i^{th}$ functional circuit is greater than the clock delay of the reference circuit, the initial phase $INV_t$ of the $i^{th}$ functional circuit may satisfy:

$$INV_t=K+(\emptyset_0-\emptyset_t)/\Delta,$$

wherein $\emptyset_0$ represents the clock delay of the reference circuit, $\emptyset_t$ represents the clock delay of the $i^{th}$ functional circuit, represents a phase difference between two adjacent clock pulses, and i is a positive integer not greater than a total number of the at least two functional circuits. Assuming that a period of each clock pulse is T0, the phase difference t may then satisfy: T0/K. For example, if K=16 and T0 is 16 ns, then Δ=T0/K=1 ns.

Based on the previous description, TAF-DPS generates the pulse of any frequency under the control of the control word F. Therefore, when the entire clock network is initiated, the control circuit 208 may distribute the control word F and the initial phase INV of each of the functional circuits to each of the corresponding TAF-DPSs. After each of the TAF-DPSs generates a clock signal based on the control word F and the initial phase INV, clock synchronization may be then completed for all the clocks. For example, the clock signals 110a-110f of the functional circuits 104a-104f may be generated based on the control words of the clock generators 106a-106f and the initial phases of the corresponding functional circuits. Then, the initial phases may be determined based on transmission distances, over which the clock signal 108 of the integrated circuit is transmitted from the clock source 102 to the functional circuits 104a-104f, and loads of the functional circuits 104a-104f.

In some embodiments, the transmission distances, over which the clock signal 108 of the integrated circuit is transmitted from the clock source 102 to the functional circuits 104a-104f, may be converted into an RC model for calculation. R represents resistance and C represents capacitance. The loads of the functional circuits 104a-104f may be converted into a capacitance model for calculation. That is, the loads of the functional circuits may be determined based on the magnitude of capacitance of the functional circuits.

Figure 8:
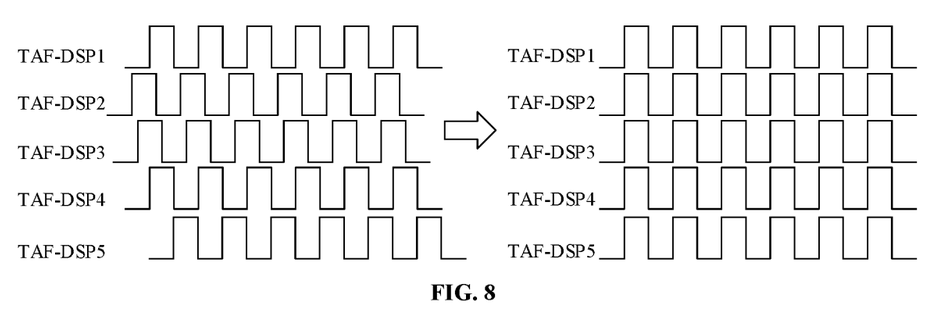
FIG. 8 illustrates a schematic diagram of another exemplary clock signal according to an embodiment of the present disclosure.

A schematic diagram showing the clock signals before and after the phase adjustment may be as illustrated in FIG. 8, which illustrates the clock signals generated by a total of five clock generators TAF-DSP1 to TAF-DSP5. Referring to FIG. 8, it can be seen that when the initial working positions of TAF-DSP1 to TAF-DSP5 have not been adjusted based on the initial phases of the corresponding functional circuits, the phase differences among the clock signals generated by the five clock generators are relatively large, and the synchronization accuracy is low. After the initial working positions of TAF-DSP1 to TAF-DSP5 have been adjusted based on the initial phases of the corresponding functional circuits, the phase differences among the clock signals generated by the five clock generators are relatively small, and the synchronization accuracy is high.

It can be understood that the smaller the phase difference A between two adjacent clock pulses among the K clock pulses of the clock signal 108, the higher the synchronization accuracy that may be achieved. Accordingly, the power consumption may somewhat increase, and the selection may be made according to the situation in actual use.

It can be seen from the above-mentioned embodiments that, in the integrated circuit according to the embodiments of the present disclosure, clock distribution is performed by using the TAF-DPS, and there is no need to introduce a delay unit to delay a clock path. The TAF-DPS is both a clock generator and a phase adjuster, which may effectively solve the problem of timing violations, reduce resource overhead, and accelerate the timing convergence.

Since the integrated circuit according to the embodiments of the present disclosure does not need to be provided with a delay unit, and may complete the clock distribution and phase adjustment by using the TAF-DPS, in some embodiments, the functional circuits and the corresponding clock generators may be formed as a digital intellectual property core (IP Core) (or which may be referred to as a soft core), which is easier to reuse between different processes, and has characteristics such as low power consumption and small area.

FIG. 7 illustrates a schematic structural diagram of another exemplary integrated circuit 200 according to an embodiment of the present disclosure. FIG. 7 may illustrate a simple frame diagram of an SoC chip. In actual scenarios, some functional circuits may be added or deleted according to the application. Each of the functional circuits 204a-204e corresponds to at least one clock generator TAF-DPSs 206a-206e. For example, the functional circuit 204a may be a central processing unit (CPU); the functional circuit 204b may be a memory controller; the functional circuit 204c may be a digital signal processor (DSP) circuit; the functional circuit 204d may be a crypto core circuit; and the functional circuit 204e may be an interface circuit.

All the functional circuits 204a-204e of the integrated circuit 200 need to work under the same clock. That is, the CPU, memory controller, DSP, crypto core, and interface need to work using the same clock source, and perform data interaction under the same clock edge. In this embodiment, the respective functional circuits have the clock delays in FIG. 9 based on the loads and transmission delays of the respective functional circuits. That is, the period of the ideal clock is 20 ns; the clock delay of the CPU circuit is 5 ns; the clock delay of the memory controller circuit is 10 ns; the clock delay of the DSP circuit is 8 ns; the clock delay of the crypto core is 1 ns; and the clock delay of the interface circuit is 7 ns.

Figure 9:
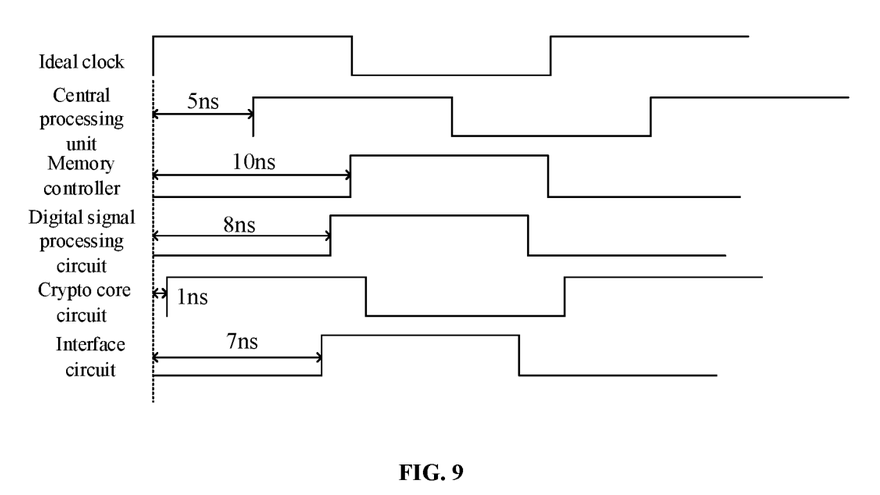
FIG. 9 illustrates a schematic diagram of an exemplary clock signal according to an embodiment of the present disclosure.

In the traditional solution, the clock sources are generated at the same location (or, are the same clock source) and distributed to the respective functional circuits; and each of the clock paths is compensated by a delay unit. It is assumed that the delay duration of a delay unit is 1 ns, and the memory controller circuit is taken as a reference circuit. Then, in this solution, 5 delay units need to be added to a clock path of the CPU; no delay unit is added to a clock path of the memory controller circuit; 2 delay units need to be added to a clock path of the DSP circuit; 9 delay units need to be added to a clock path of the crypto core circuit; and 3 delay units need to be added to a clock path of the interface circuit. As such, the clock delays of all the functional circuits may be made the same.

In the embodiment of the present disclosure, the clock source 202 generates K clock pulses and transmits them to each of the clock generators, thereby completing the generation of clocks for the respective functional circuits locally in the integrated circuit. In the embodiment of the present disclosure, assuming that a phase difference A of two adjacent clock pulses among the K clock pulses is 1 ns, a reference circuit (also referred to as a reference point) may be selected first. There are many solutions to selecting the reference circuit. For example, the memory controller circuit with the maximum clock delay may be selected as the reference circuit, and the initial phase INV of the TAF-DPS circuit of the memory controller is defined as 0. The clock signal of the CPU needs to be adjusted by 5 ns, and the initial phase INV thereof may be set to 5; the clock signal of the DSP needs to be adjusted by 2 ns, and the initial phase INV thereof may be set to 2; the clock signal of the crypto core needs to be adjusted by 9 ns, and the initial phase INV thereof may be set to 9; and the interface needs to be adjusted by 3 ns, and the initial phase INV thereof may be set to 3. In this way, all the clock generators may generate a synchronized local clock, as long as all the clock signals send the generated control words F and the corresponding initial phases INV to the clock generators corresponding to the respective functional circuits by the control circuit 208.

In some cases, the loads of the functional circuits may be different in different time periods. For example, the working states of the CPU may be divided into three states, including: standby, light load, and full load. The loads in these three states are very different, and the clock delays caused by the three states are also different. If the traditional solution is adopted, three types of clock networks (i.e., clock paths) need to be designed, and different clock networks are selected based on the load, which results in higher cost. In some embodiments, the integrated circuit according to the embodiments of the present disclosure may dynamically adjust the clock signal based on the dynamic loads of the functional circuits.

For example, a functional circuit (for example, CPU) may update its own clock delay based on a current self-load state (for example, the standby state, the light load state, or the full load state), and send the updated clock delay to the control circuit 208. In some embodiments, a method for updating a clock delay may be to calculate delay information in real time or search in a look-up table based on a pre-designed solution, i.e., searching based on a preset correspondence table of loads and clock delays.

The control circuit 208 may update (or change) the initial phase of the corresponding functional circuits based on the updated clock delay of the corresponding functional circuit, and send the updated initial phase of each of the functional circuits to the clock generator corresponding to the functional circuit, so as to generate an updated clock signal of the functional circuit. Hence, the phases of the clock signal generated by the clock generator corresponding to the functional circuit may be adjusted, i.e., completing the dynamic delay compensation for the clock network.

In the method for synchronizing the clocks for the integrated circuit according to the embodiments of the present disclosure, a chip is internally divided by functional area, and each area is assigned an independent TAF-DPS. A working phase point (i.e., an initial working position) of each of the TAF-DPSs may be selected based on the transmission distance and load conditions, thereby allowing the whole chip to work in a clock synchronization state. That is to say, all functional circuits use the clock signals from the same clock circuit, and there is no skew among these signals, which are in the clock synchronization state. The uniform clock distribution solution according to the embodiments of the present disclosure may simplify a design process, accelerate the timing convergence, and reduce the cost and overhead, and may be reused as a digital IP Core among different processes.

In some embodiments, the functional circuits and the corresponding clock generators may be formed as a digital intellectual property core (or a soft IP Core), and thus may be reused among different processes. Based on this, the foregoing integrated circuit may be directly reused in other chips, which may be added with new functional circuits according to their own needs; and the newly-added functional circuits may be provided with a synchronized clock in a fashion in the embodiments of the present disclosure.

Figure 10:
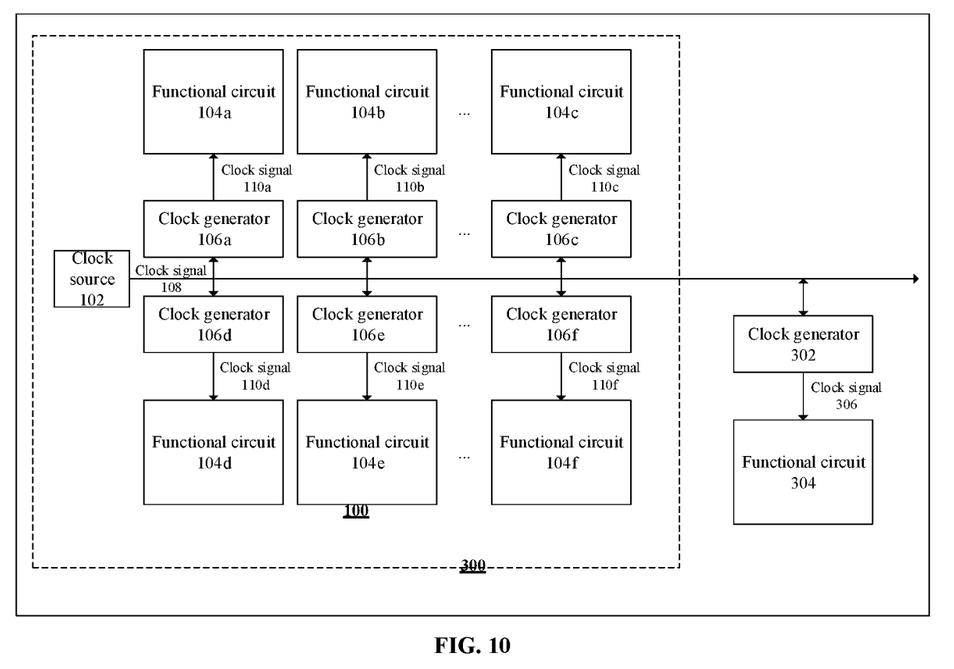
FIG. 10 illustrates a schematic structural diagram of still another exemplary integrated circuit according to an embodiment of the present disclosure.

FIG. 10 illustrates a schematic structural diagram of still another exemplary integrated circuit 300 according to an embodiment of the present disclosure.

The integrated circuit 300 may include the reused integrated circuit 100, and may further include a newly-added functional circuit 304 and a corresponding clock generator 302.

The clock generator 302 may be configured to:
determine an initial phase of the newly-added functional circuit 304; and
generate a clock signal 306 of the newly-added functional circuit 304 based on the clock signal 108 of the integrated circuit and the initial phase of the newly-added functional circuit 304, so as to keep in the clock signal of the newly-added functional circuit 304 and clock signals of other functional circuits 104a-104f synchronized,
wherein the initial phase is determined based on a transmission distance, over which the clock signal of the integrated circuit is transmitted from the clock source 102 to the newly-added functional circuit 304, and a load of the newly-added functional circuit 304.

In this way, by reusing the circuits that have been set, the newly-added functional circuit and clock generator may be set correspondingly in the new integrated circuit 300 according to the same rules, thereby completing the design of the integrated circuit 300, which greatly improves the development efficiency.

Figure 11:
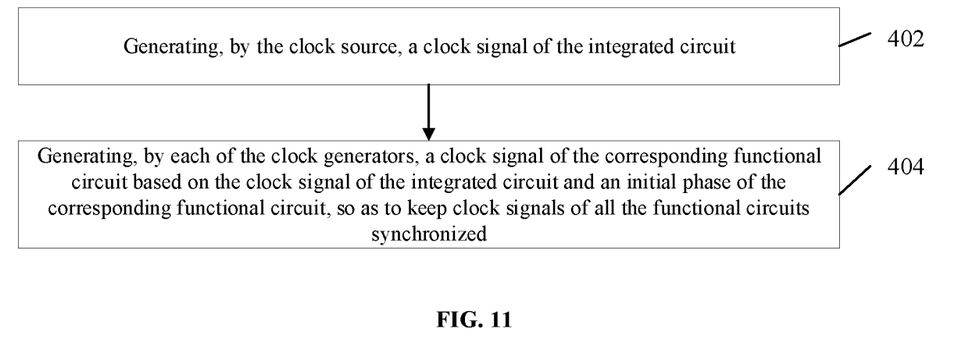
FIG. 11 illustrates a schematic flowchart of an exemplary method according to an embodiment of the present disclosure.

FIG. 11 illustrates a schematic flowchart of an exemplary method according to an embodiment of the present disclosure. As illustrated in FIG. 11, the method for synchronizing the clocks for the integrated circuit includes the following steps.

In step 402, a clock signal of the integrated circuit is generated by a clock source.

In step 404, a clock signal of the corresponding functional circuit is generated by each of the clock generators based on the clock signal of the integrated circuit and an initial phase of the corresponding functional circuit, so as to keep clock signals of all the functional circuits synchronized.

The initial phase is determined based on a transmission distance, over which the clock signal of the integrated circuit is transmitted from the clock source to the corresponding functional circuit, and a load of the corresponding functional circuit.

Figure 12:
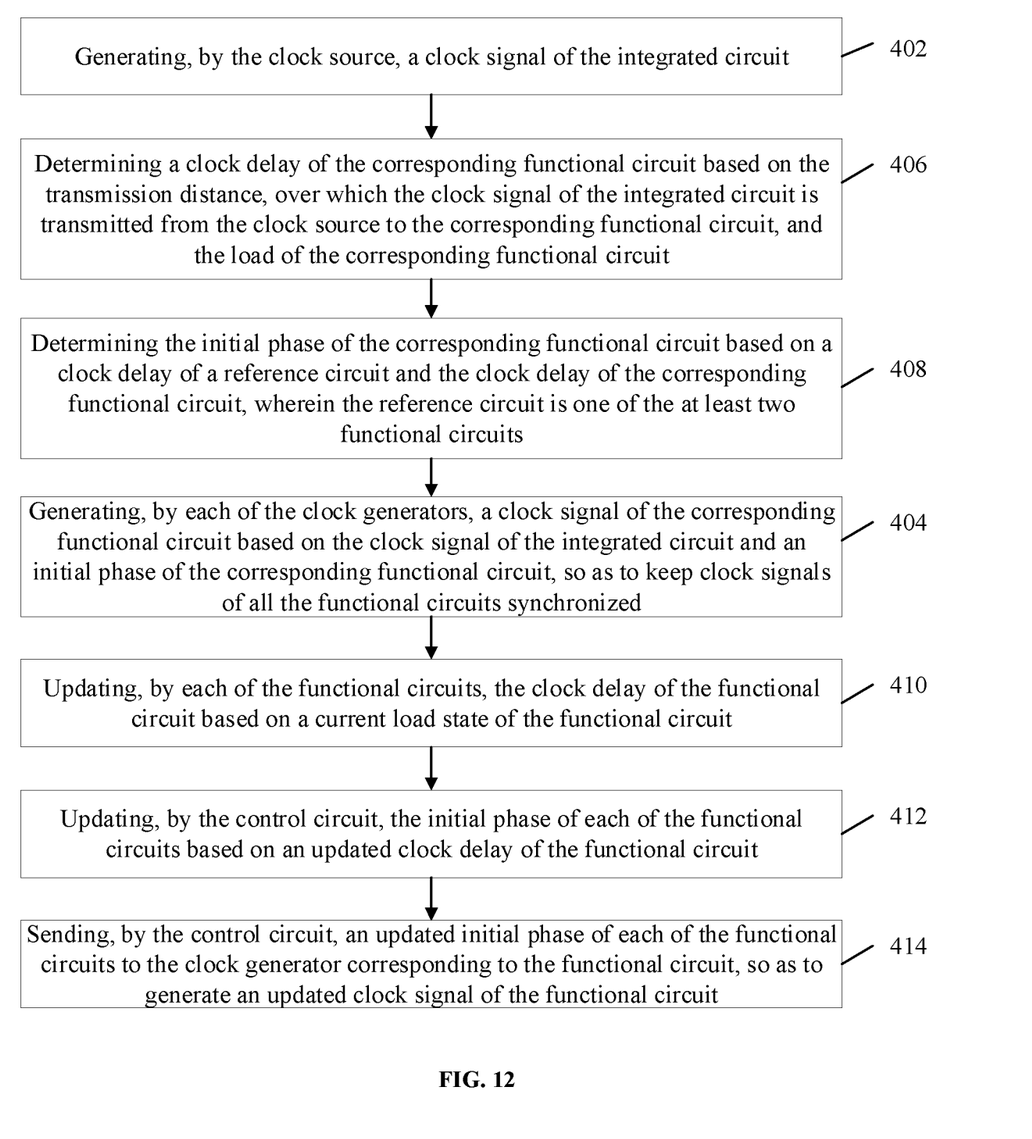
FIG. 12 illustrates a schematic flowchart of another exemplary method according to an embodiment of the present disclosure.

In some embodiments, as illustrated in FIG. 12, the method for synchronizing the clock includes:

In step 406, a clock delay of the corresponding functional circuit is determined based on the transmission distance, over which the clock signal of the integrated circuit is transmitted from the clock source to the corresponding functional circuit, and the load of the corresponding functional circuit.

In step 408, the initial phase of the corresponding functional circuit is determined based on a clock delay of a reference circuit and the clock delay of the corresponding functional circuit.

The reference circuit is one of the at least two functional circuits.

Optionally, as illustrated in FIG. 7, the integrated circuit further includes a control circuit 208, and the steps 406 and 408 described above may be implemented by the control circuit 208. That is to say, for each of the functional circuits, the clock delay of the functional circuit may be determined by the control circuit based on the transmission distance, over which the clock signal of the integrated circuit is transmitted from the clock source to the functional circuit, and the load of the functional circuit. Moreover, an initial phase of the reference circuit may be determined to be 0 by the control circuit; and for the functional circuits other than the reference circuit, the initial phase of the corresponding functional circuits may be determined by the control circuit based on the clock delay of the reference circuit and the clock delay of the corresponding functional circuit. Further, the initial phase of each of the functional circuits may be sent to the clock generator corresponding to the functional circuit by the control circuit to generate the clock signal of the functional circuit.

In some embodiments, the clock signal of the integrated circuit includes K clock pulses, and K is an integer greater than 1;
if the clock delay of the $i^{th}$ functional circuit is smaller than or equal to the clock delay of the reference circuit, the initial phase $INV_t$ of the $i^{th}$ functional circuit satisfies:

$$INV_t=(Ø_0-Ø_t)/\Delta;$$

and
if the clock delay of the $i^{th}$ functional circuit is greater than the clock delay of the reference circuit, the initial phase $INV_t$ of the $i^{th}$ functional circuit satisfies:

$$INV_t=K+(Ø_0-Ø_t)/\Delta,$$

wherein $Ø_0$ represents the clock delay of the reference circuit, represents the clock delay of the $i^{th}$ functional circuit, $\Delta$ represents a phase difference between two adjacent clock pulses, and i is a positive integer not greater than a total number of the at least two functional circuits.

In some embodiments, continuing to refer to FIG. 12, the method may further include the following steps In step 410, the clock delay is updated by each of the functional circuits based on a current load state of the functional circuit.

In step 412, the initial phase of each of the functional circuits is updated by the control circuit based on the updated clock delay of the functional circuit.

In step 414, the updated initial phase of each of the functional circuits is sent to the clock generator corresponding to the functional circuit by the control circuit, so as to generate an updated clock signal of the functional circuit.

In some embodiments, the clock generators are clock generators based on time-average-frequency direct period synthesis; and the clock signals of the functional circuits are generated based on the clock signal of the integrated circuit, control words of the clock generators and the initial phases of the functional circuits.

In some embodiments, the functional circuits include a central processing unit, a memory controller, a digital signal processor circuit, a crypto core circuit, or an interface circuit.

In some embodiments, the functional circuits and the corresponding clock generators form a digital intellectual property core.

In some embodiments, the method may further include:
determining a newly-added functional circuit and a corresponding newly-added clock generator;
determining, by the newly-added clock generator, an initial phase of the newly-added functional circuit; and
generating, by the newly-added clock generator, a clock signal of the newly-added functional circuit based on the clock signal of the integrated circuit and the initial phase of the newly-added functional circuit, so as to keep the clock signal of the newly-added functional circuit and clock signals of other functional circuits synchronized,
wherein the initial phase is determined based on a transmission distance, over which the clock signal of the integrated circuit is transmitted from the clock source to the newly-added functional circuit, and a load of the newly-added functional circuit.

Figure 13:
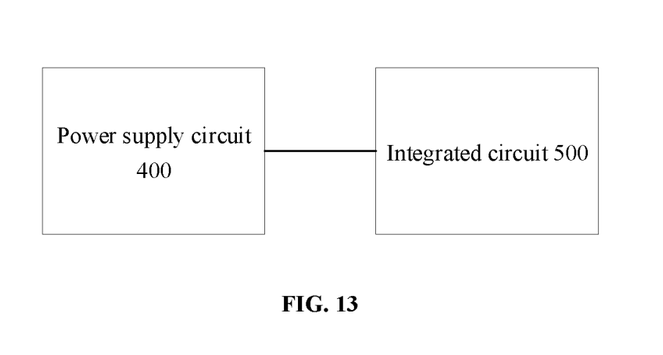
FIG. 13 illustrates a schematic structural diagram of an electronic device according to an embodiment of the present disclosure.

The embodiment of the present disclosure also provides an electronic device. As illustrated in FIG. 13, the electronic device includes: a power supply circuit 400 and an integrated circuit 500. The power supply circuit 400 is configured to supply power to the integrated circuit 500, which may be the integrated circuit provided in the embodiment described above. For example, the integrated circuit 500 may be an integrated circuit as illustrated in FIG. 1, FIG. 7 or FIG. 10.

It should be noted that the method according to the present disclosure may be executed by a single device, such as a computer or a server. The method according to this embodiment is also applicable to a distributed scenario, in which the method is accomplished by the mutual coordination of a plurality of devices. In the case of such a distributed scenario, one of the plurality of devices may only execute one or more steps of the method according to the present specification; and the plurality of devices will interact with each other to accomplish the described method.

It should be noted that the specific embodiments of the present disclosure are described above. Other embodiments shall fall within the scope of the appended claims. In some cases, the operations and steps recorded in the claims can be executed in an order different from that in the embodiments to achieve a desired result as well. In addition, the processes depicted in the accompanying drawings are not necessarily performed based on the illustrated specific order or continuous order to achieve the desired result. In some embodiments, multi-task processing and parallel processing are also possible or may be advantageous.

The integrated circuit in the foregoing embodiments is configured to implement the corresponding method for synchronizing the clock in any one of the embodiments described above, and has the beneficial effects of the corresponding method embodiments, the details of which will not be repeated here.

A person of ordinary skill in the art should understand that the discussion of any of the above embodiments is merely for an exemplary purpose, and is not intended to imply that the scope of the present disclosure (including the claims) is limited to these examples. Under the concept of the present disclosure, the above embodiments or the technical features in different embodiments may also be combined; and the steps may be accomplished in any order. Moreover, many other variations in different aspects of the present disclosure as described above are possible but not provided in the detail for the sake of brevity.

In addition, for the brevity of description and discussion and in order not to obscure the present disclosure, the well-known power/ground connections to the integrated circuit (IC) chips and other components may or may not be illustrated in the provided drawings. In addition, the devices may be illustrated in the form of block diagrams in order not to obscure the present disclosure, and the consideration is also given to the fact that the details about the embodiments of the devices in these block diagrams are highly dependent on the platform on which the present disclosure will be implemented (that is, these details should be fully within the understanding of those skilled in the art). In the case where the specific details (for example, the circuits) are set forth to describe the exemplary embodiments of the present disclosure, it is obvious to those skilled in the art that the present disclosure may be implemented without these specific details or with these specific details changed. Therefore, these descriptions should be considered illustrative rather than limiting.

Although the present disclosure has been described in combination with the specific embodiments of the present disclosure, many substitutions, modifications and variations of these embodiments will be apparent to those of ordinary skill in the art based on the foregoing description. For example, the discussed embodiments may be used in other memory architectures (for example, a dynamic RAM (DRAM)).

The present disclosure is intended to cover all such substitutions, modifications and variations that fall within the broad scope of the appended claims. Therefore, any omission, modification, equivalent substitution, improvement and the like made within the spirit and principle of the present disclosure shall be construed as being included in the protection scope of the present disclosure.

What is claimed is:

1. An integrated circuit, comprising:
   a clock source configured to generate a clock signal of the integrated circuit;
   at least two functional circuits; and
   at least two clock generators corresponding to the at least two functional circuits, wherein each of the clock generators is electrically coupled to the clock source and electrically coupled to a corresponding functional circuit, and is configured to:
   generate a clock signal of the corresponding functional circuit based on the clock signal of the integrated circuit and an initial phase of the corresponding functional circuit, so as to keep clock signals of all the functional circuits synchronized,
   wherein the initial phase of the corresponding functional circuit is determined based on a clock delay of a reference circuit and a clock delay of the corresponding functional circuit, and the reference circuit is one of the at least two functional circuits; and the clock delay of the corresponding functional circuit is determined based on a transmission distance, over which the clock signal of the integrated circuit is transmitted from the clock source to the corresponding functional circuit, and a load of the corresponding functional circuit.

2. The integrated circuit according to claim 1, further comprising a control circuit, which is configured to:
   determine, for each of the functional circuits, the clock delay of the functional circuit based on a transmission distance, over which the clock signal of the integrated circuit is transmitted from the clock source to the functional circuit, and a load of the functional circuit;

determine, for each of the functional circuits other than the reference circuit, an initial phase of the functional circuit based on a clock delay of the reference circuit and a clock delay of the functional circuit; and send an initial phase of each of the functional circuits to a clock generator corresponding to the functional circuit to generate the clock signal of the functional circuit.

3. The integrated circuit according to claim 2, wherein the clock signal of the integrated circuit includes K clock pulses, and K is an integer greater than 1;

if a clock delay of an $i^{th}$ functional circuit is smaller than or equal to the clock delay of the reference circuit, an initial phase $INV_i$ of the $i^{th}$ functional circuit satisfies: $INV_i=(\varnothing_0-\varnothing_i)/\Delta$; and if the clock delay of the $i^{th}$ functional circuit is greater than the clock delay of the reference circuit, the initial phase $INV_i$ of the $i^{th}$ functional circuit satisfies: $INV_i=K+(\varnothing_0-\varnothing_i)/\Delta$, wherein $\varnothing_0$ represents the clock delay of the reference circuit, $\varnothing_i$ represents the clock delay of the $i^{th}$ functional circuit, $\Delta$ represents a phase difference between two adjacent clock pulses, and i is a positive integer not greater than a total number of the at least two functional circuits.

4. The integrated circuit according to claim 3, wherein K is equal to an integer power of 2.

5. The integrated circuit according to claim 2, wherein the reference circuit is a functional circuit with a maximum clock delay among the at least two functional circuits.

6. The integrated circuit according to claim 2, wherein each of the functional circuits is configured to: update the clock delay of the functional circuit based on a current load state of the functional circuit; and the control circuit is further configured to:

update the initial phase of each of the functional circuits based on an updated clock delay of the functional circuit; and send an updated initial phase of each of the functional circuits to the clock generator corresponding to the functional circuit, so as to generate an updated clock signal of the functional circuit.

7. The integrated circuit according to claim 1, wherein the clock generators are clock generators based on time-average-frequency direct period synthesis; and clock signals of the functional circuits are generated based on the clock signal of the integrated circuit, control words of the clock generators and initial phases of the functional circuits.

8. The integrated circuit according to claim 7, further comprising a control circuit, which is configured to:

send the acquired control words to each of the clock generators, respectively.

9. The integrated circuit according to claim 1, wherein the clock source is implemented in one of the following forms:

a Johnson counter; and a plurality of cross-coupled NAND gates.

10. The integrated circuit according to claim 1, further comprising a newly-added functional circuit and a corresponding newly-added clock generator, wherein the newly-added clock generator is configured to:

determine an initial phase of the newly-added functional circuit; and generate a clock signal of the newly-added functional circuit based on the clock signal of the integrated circuit and the initial phase of the newly-added functional circuit, so as to keep the clock signal of the newly-added functional circuit and clock signals of other functional circuits synchronized;

wherein the initial phase is determined based on a transmission distance, over which the clock signal of the integrated circuit is transmitted from the clock source to the newly-added functional circuit, and a load of the newly-added functional circuit.

11. The integrated circuit according to claim 4, wherein the reference circuit is a functional circuit with a maximum clock delay among the at least two functional circuits; the clock source is implemented in one of the following forms: a Johnson counter, and a plurality of cross-coupled NAND gates;

the clock generators are clock generators based on time-average-frequency direct period synthesis; and clock signals of the functional circuits are generated based on the clock signal of the integrated circuit, control words of the clock generators and initial phases of the functional circuits; and the control circuit is further configured to: send the acquired control words to each of the clock generators, respectively;

the functional circuits are configured to: update the clock delay of the functional circuit based on a current load state of the functional circuit; and the control circuit is further configured to: update the initial phase of each of the functional circuits based on an updated clock delay of the functional circuit; and send an updated initial phase of each of the functional circuits to the clock generator corresponding to the functional circuit, so as to generate an updated clock signal of the functional circuit.

12. A method for synchronizing clocks for an integrated circuit, wherein the integrated circuit comprises a clock source, at least two functional circuits, and at least two clock generators corresponding to the at least two functional circuits; and the method comprises:

generating, by the clock source, a clock signal of the integrated circuit;

determining a clock delay of a corresponding functional circuit based on a transmission distance, over which the clock signal of the integrated circuit is transmitted from the clock source to the corresponding functional circuit, and a load of the corresponding functional circuit; and determining an initial phase of the corresponding functional circuit based on a clock delay of a reference circuit and the clock delay of the corresponding functional circuit, wherein the reference circuit is one of the at least two functional circuits; and generating, by each of the clock generators, a clock signal of the corresponding functional circuit based on the clock signal of the integrated circuit and the initial phase of the corresponding functional circuit, so as to keep clock signals of all the functional circuits synchronized.

13. The method according to claim 12, wherein the integrated circuit further comprises a control circuit; and the method further comprises:

determining, by the control circuit and for each of the functional circuits, the clock delay of the functional circuit based on a transmission distance, over which the clock signal of the integrated circuit is transmitted from the clock source to the functional circuit, and a load of the functional circuit;

determining, by the control circuit and for each of the functional circuits other than the reference circuit, an initial phase of the functional circuit based on a clock delay of the reference circuit and a clock delay of the functional circuit; and sending, by the control circuit, an initial phase of each of the functional circuits to a clock generator corresponding to the functional circuit to generate the clock signal of the functional circuit.

14. The method according to claim 13, wherein the clock signal of the integrated circuit includes K clock pulses, and K is an integer greater than 1;

if a clock delay of an $i^{th}$ functional circuit is smaller than or equal to the clock delay of the reference circuit, an initial phase $INV_i$ of the $i^{th}$ functional circuit satisfies: $INV_i=(\emptyset_0-\emptyset_i)/\Delta$; and if the clock delay of the $i^{th}$ functional circuit is greater than the clock delay of the reference circuit, the initial phase $INV_i$ of the $i^{th}$ functional circuit satisfies: $INV_i=K+(\emptyset_0-\emptyset_i)/\Delta$, wherein $\emptyset_0$ represents the clock delay of the reference circuit, $\emptyset_i$ represents the clock delay of the $i^{th}$ functional circuit, $\Delta$ represents a phase difference between two adjacent clock pulses, and i is a positive integer not greater than a total number of the at least two functional circuits.

15. The method according to claim 13, further comprising:

updating, by each of the functional circuits, the clock delay of the functional circuit based on a current load state of the functional circuit;

updating, by the control circuit, the initial phase of each of the functional circuits based on an updated clock delay of the functional circuit; and sending, by the control circuit, an updated initial phase of each of the functional circuits to the clock generator corresponding to the functional circuit, so as to generate an updated clock signal of the functional circuit.

16. The method according to claim 12, wherein the clock generators are clock generators based on time-average-frequency direct period synthesis; and clock signals of the functional circuits are generated based on the clock signal of the integrated circuit, control words of the clock generators and initial phases of the functional circuits.

17. The method according to claim 12, further comprising:

determining a newly-added functional circuit and a corresponding newly-added clock generator;

determining, by the newly-added clock generator, an initial phase of the newly-added functional circuit; and generating, by the newly-added clock generator, a clock signal of the newly-added functional circuit based on the clock signal of the integrated circuit and the initial phase of the newly-added functional circuit, so as to keep the clock signal of the newly-added functional circuit and clock signals of other functional circuits synchronized, wherein the initial phase is determined based on a transmission distance, over which the clock signal of the integrated circuit is transmitted from the clock source to the newly-added functional circuit, and a load of the newly-added functional circuit.

18. An electronic device, comprising: a power supply circuit and an integrated circuit, wherein the power supply circuit is configured to supply power to the integrated circuit; and the integrated circuit comprises:

a clock source configured to: generate a clock signal of the integrated circuit;

at least two functional circuits; and at least two clock generators corresponding to the at least two functional circuits, wherein each of the clock generators is electrically coupled to the clock source and electrically coupled to a corresponding functional circuit, and is configured to:

generate a clock signal of the corresponding functional circuit based on the clock signal of the integrated circuit and an initial phase of the corresponding functional circuit, so as to keep clock signals of all the functional circuits synchronized, wherein the initial phase of the corresponding functional circuit is determined based on a clock delay of a reference circuit and a clock delay of the corresponding functional circuit, and the reference circuit is one of the at least two functional circuits; and the clock delay of the corresponding functional circuit is determined based on a transmission distance, over which the clock signal of the integrated circuit is transmitted from the clock source to the corresponding functional circuit, and a load of the corresponding functional circuit.

19. The electronic device according to claim 18, wherein the integrated circuit further comprises a control circuit, which is configured to:

determine, for each of the functional circuits, the clock delay of the functional circuit based on a transmission distance, over which the clock signal of the integrated circuit is transmitted from the clock source to the functional circuit, and a load of the functional circuit;

determine, for each of the functional circuits other than the reference circuit, an initial phase of the functional circuit based on a clock delay of the reference circuit and a clock delay of the functional circuit; and send an initial phase of each of the functional circuits to a clock generator corresponding to the functional circuit to generate the clock signal of the functional circuit.

20. The electronic device according to claim 19, wherein the clock signal of the integrated circuit includes K clock pulses, and K is an integer greater than 1;

if a clock delay of an $i^{th}$ functional circuit is smaller than or equal to the clock delay of the reference circuit, an initial phase $INV_i$ of the $i^{th}$ functional circuit satisfies: $INV_i=(\emptyset_0-\emptyset_i)/\Delta$; and if the clock delay of the $i^{th}$ functional circuit is greater than the clock delay of the reference circuit, the initial phase $INV_i$ of the $i^{th}$ functional circuit satisfies: $INV_i=K+(\emptyset_0-\emptyset_i)/\Delta$, wherein $\emptyset_0$ represents the clock delay of the reference circuit, $\emptyset_i$ represents the clock delay of the $i^{th}$ functional circuit, $\Delta$ represents a phase difference between two adjacent clock pulses, and i is a positive integer not greater than a total number of the at least two functional circuits.

* * * * *